United States Patent
Martin et al.

(10) Patent No.: US 6,448,617 B1
(45) Date of Patent: Sep. 10, 2002

(54) SEMICONDUCTOR READ-ONLY MEMORY CONFIGURATION WITH SUBSTRATE CONTACTS AND POLYSILICON BRIDGE CELLS

(75) Inventors: Ekkart Martin, München; Martin Ostermayr, Haar, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/950,428

(22) Filed: Sep. 10, 2001

Related U.S. Application Data

(63) Continuation of application No. PCT/DE00/00615, filed on Mar. 1, 2000.

(30) Foreign Application Priority Data

Mar. 9, 1999 (DE) .......................................... 199 10 353

(51) Int. Cl.[7] .......................... H01L 29/76; H01L 29/94; H01L 31/062; H01L 31/113
(52) U.S. Cl. ........................ 257/390; 257/208; 365/104
(58) Field of Search ................................ 257/390, 391, 257/208, 210, 211; 365/103, 104

(56) References Cited

U.S. PATENT DOCUMENTS 5,561,624 A * 10/1996 Chen et al. .................. 365/104
6,204,541 B1 * 3/2001 Togami et al. .............. 257/390

FOREIGN PATENT DOCUMENTS

DE 3427 423 A1 2/1985

* cited by examiner

*Primary Examiner*—Ngân V. Ngô
(74) *Attorney, Agent, or Firm*—Laurence A. Greenberg; Werner H. Stemer; Ralph E. Locher

(57) ABSTRACT

A semiconductor read-only memory configuration in which two intermediate cell halves are directly adjacent to one another perpendicularly to the longitudinal direction of a word line and are periodically repeated in the longitudinal direction of the word line. In a first intermediate cell half, the polycrystalline silicon of the word lines is ruptured and a substrate contact is set, and in a second intermediate cell half, the polycrystalline silicon is refreshed. These intermediate cell halves are adjacent to one another, and the first and the second intermediate cell halves are alternately interchanged. Instead of requiring two intermediate cells, the semiconductor read-only memory configuration requires just one intermediate cell that includes the two intermediate cell halves which are used in an alternately mirrored manner.

6 Claims, 4 Drawing Sheets

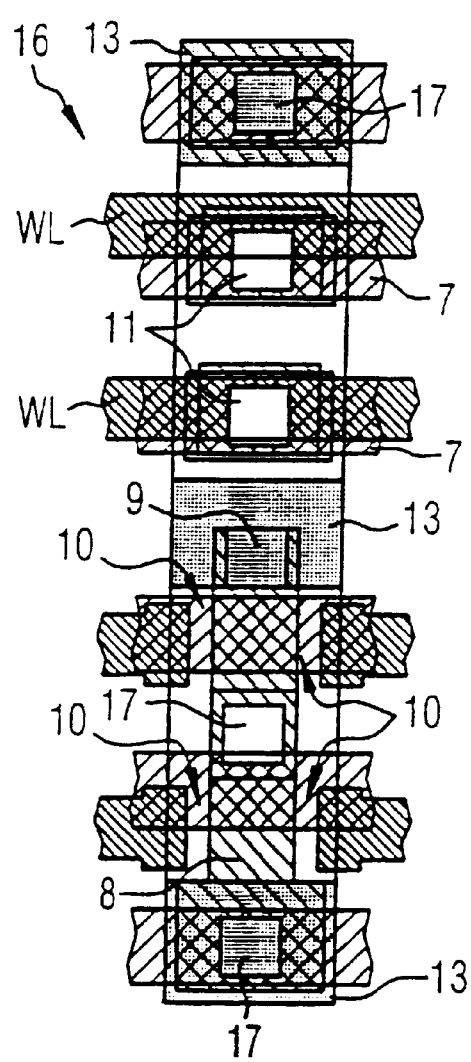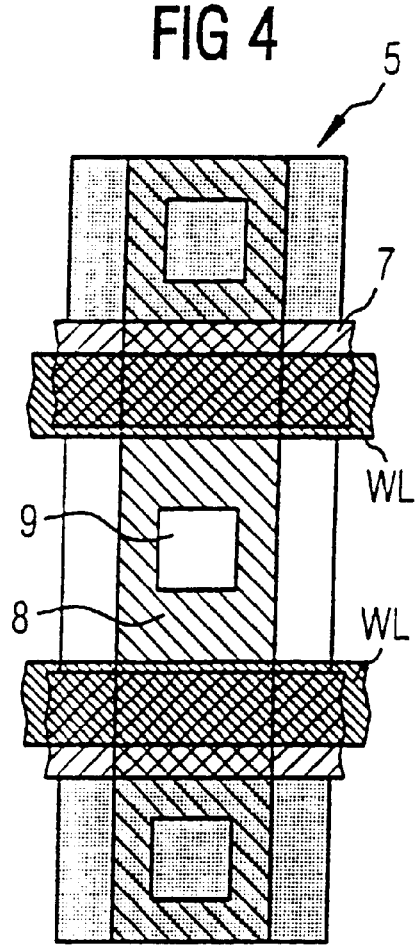
FIG 2
FIG 4
PRIOR ART

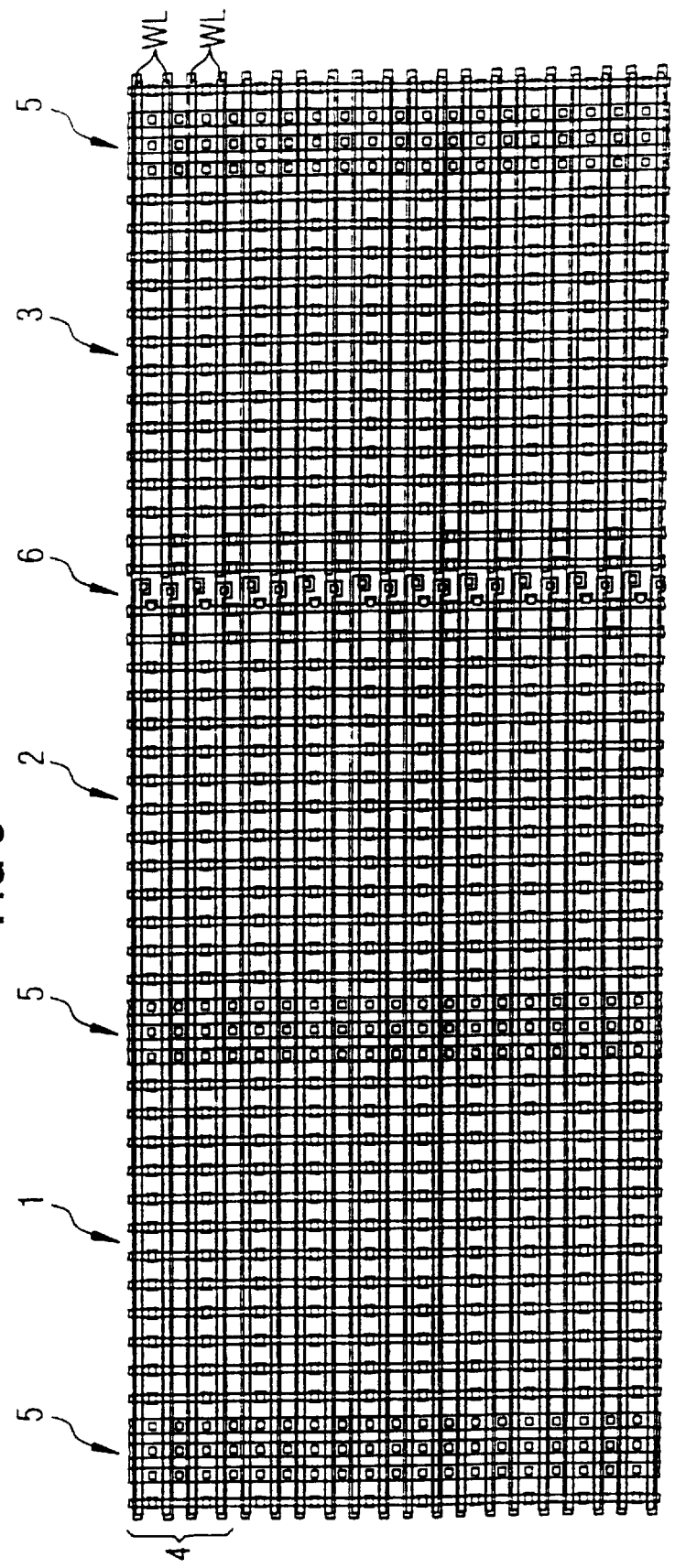

PRIOR ART

US 6,448,617 B1

SEMICONDUCTOR READ-ONLY MEMORY CONFIGURATION WITH SUBSTRATE CONTACTS AND POLYSILICON BRIDGE CELLS

CROSS-REFERENCE TO RELATED APPLICATION

This application is a continuation of copending International Application No. PCT/DE00/00615, filed Mar. 01, 2000, which designated the United States.

BACKGROUND OF THE INVENTION

FIELD OF THE INVENTION

The present invention relates to a semiconductor read-only memory configuration having a semiconductor substrate and a to multiplicity of memory cells configured in a memory cell array in the semiconductor substrate. Each memory cell includes a plurality of transistors. The memory configuration includes word lines composed of polycrystalline silicon, and includes metal tracks, which run parallel to the word lines and which are isolated from the latter by an intermediate insulator. The word lines are ruptured in their longitudinal direction in each case after a first number of memory cells and can be refreshed via the metal tracks. A reference-ground potential can be applied to the semiconductor substrate via a substrate contact, in each case, after a second number of memory cells.

As is known, there are semiconductor read-only memory configurations with so-called diffusion read-only memories (ROMs) and so-called contact ROMs. In the case of diffusion ROMs, a diffusion is finally introduced in the entire memory cell array through a customized definition, while in the case of contact ROMs, the last step consists in providing the respective contacts in a manner corresponding to the customized definition. The diffusion involves the introduction of source zones and drain zones, while source contacts and drain contacts are created during the provision of the contacts.

In detail, in a memory cell array, the individual memory cells or the MOS field-effect transistors are completed except for the source and the drain diffusion or except for the source and the drain contacts. In accordance with the memory content to be stored in the read-only memory configuration, the individual transistors are then provided with the source and the drain diffusion or with the source and the drain contacts. In this case, a transistor with diffusion (or contacts) signifies a logic "0", while a transistor without diffusion (or without contacts) is assigned a logic "1". In other words, if a transistor is present, then this means a logic "0", while the absence of a transistor through the absence of diffusion or contacts is assigned to a logic "1".

In the memory cell array of such a semiconductor read-only memory configuration, it is necessary, then, to effect a well contact connection, a so-called rupture of the word line and a metal/polysilicon bridge. In the case of the well contact connection, a so-called substrate contact applies the reference-ground potential Vss to the well zone of the memory cells, while the word line is ruptured, since the polycrystalline silicon forming the word line must be interrupted after specific lengths for capacitance reasons or according to the so-called "ESD (Electrostatic Discharge) rules". Moreover, it is necessary for the signals impressed on the polycrystalline silicon of the word lines likewise to be refreshed after a specific length. This is done, then, as follows: after a technology-dependent x-fold, for example 100-fold, width of a transistor via which a word line is led, the polycrystalline silicon thereof is interrupted and the word line is refreshed by a metal/polysilicon bridge. For this metal/polysilicon bridge, a metal track made, for example, of aluminum or copper runs above the polycrystalline silicon of the word line, and is isolated from the latter by an intermediate insulator made, for example, of silicon dioxide. In order to refresh a signal that is transferred by the polycrystalline silicon of the word line, a connection is established between the metal track and the polycrystalline silicon.

If it is assumed that, by way of example, eight transistors arranged in two rows form a memory cell, then after a first number of memory cells, for example three memory cells, a substrate contact is provided, while a rupture of the word line or of the refresh thereof is in each case performed after a second number of memory cells, for example, nine memory cells.

The well contact connection with the substrate contacts and also rupture and refresh of the word line thus do not take place in the memory cells of the memory cell array, but rather at regular intervals along the individual word lines. This inevitably necessitates further intermediate cells. In each case, after a first number of memory cells, an intermediate cell is provided for a substrate contact for the well contact connection, while rupture and refresh of the word line are effected, in each case, after a second number of memory cells.

FIG. 3 shows a plan view of a conventional semiconductor read-only memory configuration having memory cell arrays 1 to 3, which each include memory cells having 4×2 transistors. After every three memory cells (in this respect cf. an upper row 4 of these memory cells), an intermediate cell 5 is present with a substrate contact via which reference-ground potential Vss is applied to the well of the memory cell arrays 1 to 3. At an interval of every nine memory cells, there is a rupture and a refresh of the word lines WL is performed at intermediate cells 6. Here, the polycrystalline silicon of the word lines is interrupted, and in each case, is connected by the overlying intermediate insulator to the metal track that is guided thereon.

Thus, in the case of the existing semiconductor read-only memory configuration, a relatively large amount of space is required for the intermediate cells, as can be seen from the plan view of FIG. 3.

FIG. 4 shows one of the intermediate cells 5 on an enlarged scale. A metal layer or track 7 is arranged above a word line WL made of polycrystalline silicon, is isolated from the latter by an intermediate insulator, and runs parallel to the polycrystalline silicon of the word line WL. A metalization layer 8 is provided above this metal track 7, which is likewise isolated from the metal track 7 by an intermediate insulator. This metalization layer 8 feeds reference-ground potential Vss, via a substrate contact 9, to the well of the memory cell arrays.

FIG. 5 shows an intermediate cell 6 with an interruption or a rupture 10 of the polycrystalline silicon of the word line WL. A plated-through hole 11 is provided between the respective metal track 7 and the polycrystalline silicon of the underlying word line WL, and a substrate contact 12 is provided.

To summarize, then, it must be emphasized that two different intermediate cells are required in existing semiconductor read-only memory configurations. The first intermediate cells serve for well contact connection, while rupture, refresh and well contact connection of the polycrystalline silicon of the word lines are performed in the second intermediate cells. Overall, this requires that the two intermediate cells occur frequently, which necessarily entails a reduction in the number of actual memory cells between the intermediate cells. Ultimately, this means that memory space is lost in the semiconductor read-only memory configuration, which is a critical obstacle to further miniaturization of the configuration.

SUMMARY OF THE INVENTION

It is accordingly an object of the invention to provide a semiconductor read-only memory configuration which overcomes the above-mentioned disadvantageous of the prior art apparatus of this general type. In particular, it is an object of the invention to provide a semiconductor read-only memory configuration which requires less space through the use of fewer intermediate cells for substrate contacts, rupture and refresh, and thus allows the area that is available for the actual memory cells to be enlarged.

With the foregoing and other objects in view there is provided, in accordance with the invention, a semiconductor read-only memory configuration, that includes: a semiconductor substrate; a memory cell array located in the semiconductor substrate; a plurality of memory cells configured in the memory cell array, each one of the plurality of memory cells including a plurality of transistors; word lines made of polycrystalline silicon, the word lines running in a longitudinal direction, the word lines formed with ruptures located in the longitudinal direction after a first number of the plurality of the memory cells; metal tracks running parallel to the word lines for refreshing the word lines; an intermediate insulator isolating the word lines from the metal tracks; a plurality of substrate contacts, each one of the plurality of the substrate contacts located after a second number of the plurality of the memory cells for applying a reference-ground potential to the semiconductor substrate; and a plurality of intermediate cells periodically located in the longitudinal direction. Each one of the plurality of the intermediate cells includes a first intermediated cell half and a second intermediate cell half that are directly adjacent to one another perpendicularly to the longitudinal direction and that are alternately interchanged. The first intermediate cell half affects a respective one of the ruptures of a respective one of the word lines and includes a respective one of the plurality of the substrate contacts. The second intermediate cell half refreshes the polycrystalline silicon of the respective one of the word lines.

In the case of the semiconductor read-only memory configuration of the type mentioned in the introduction, this object is achieved by providing two intermediate cell halves that are directly adjacent to one another perpendicularly to the longitudinal direction of the word line and that are periodically repeated in the longitudinal direction of the word line. In a first intermediate cell half, the polycrystalline silicon of the word lines is ruptured and a substrate contact is set, and in a second intermediate cell half, the polycrystalline silicon is refreshed. These intermediate cell halves are adjacent to one another, and the first and the second intermediate cell halves are alternately interchanged.

Instead of two intermediate cells, the invention requires just one intermediate cell including two intermediate cell halves which are used in an alternately mirrored manner.

For example, consider the case when two memory cells lie one above the other and include a total of 4×4 transistors, then in the intermediate cell half for the upper memory cell including 4×2 transistors, the polycrystalline silicon is ruptured and the well contact connection is performed with the aid of a substrate contact. In the lower intermediate cell, half for the lower memory cells that likewise include 4×2 transistors, the word line is refreshed by bridging the metal track to the polycrystalline silicon by means of contacts made of tungsten. This intermediate cell is used alternately, so that in each case one of the two rows of upper and lower memory cells is sometimes interrupted and sometimes refreshed.

The configuration of the intermediate cells that extends over two rows of memory cells enables a space saving in the order of magnitude of 42 to 47%, since only one type of intermediate cell is required, which is used in an alternately mirrored manner. The use of only one type of intermediate cell results, moreover, in a simplified construction of the semiconductor read-only memory configuration.

In accordance with an added feature of the invention, the semiconductor read-only memory configuration can readily be used with memory cells which have diffusion ROMs or contact ROMs. Furthermore, in the configuration, a well contact connection takes place with the same frequency as a rupture or a refresh of the polycrystalline silicon of the word lines.

In accordance with a concomitant feature of the invention, the individual contacts for well contact connection, that is to say the substrate contacts, and also the plated-through holes for the refresh lie in a row perpendicularly to the longitudinal direction of the word lines, so that the intermediate cell constructed in this way requires a particularly small amount of space. By virtue of the intermediate cell height extending over two memory cells, that is to say overall an "even-numbered" cell height of the intermediate cell, the design of the semiconductor read-only memory configuration is facilitated since the intermediate cell is extended over two rows of memory cells.

Other features which are considered as characteristic for the invention are set forth in the appended claims.

Although the invention is illustrated and described herein as embodied in Semiconductor read-only memory configuration with substrate contacts and polysilicon bridge cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF-DESCRIPTION OF THE DRAWINGS

FIG. 2 shows an enlarged plan view of an intermediate cell of a semiconductor read-only memory configuration;

FIG. 3 shows a plan view of a prior art semiconductor read-only memory configuration;

FIG. 4 shows an enlarged plan view of an intermediate cell of a prior art semiconductor read-only memory configuration.

DESCRIPTION OF THE PREFERRED EMBODIMENTS

Figure 5:
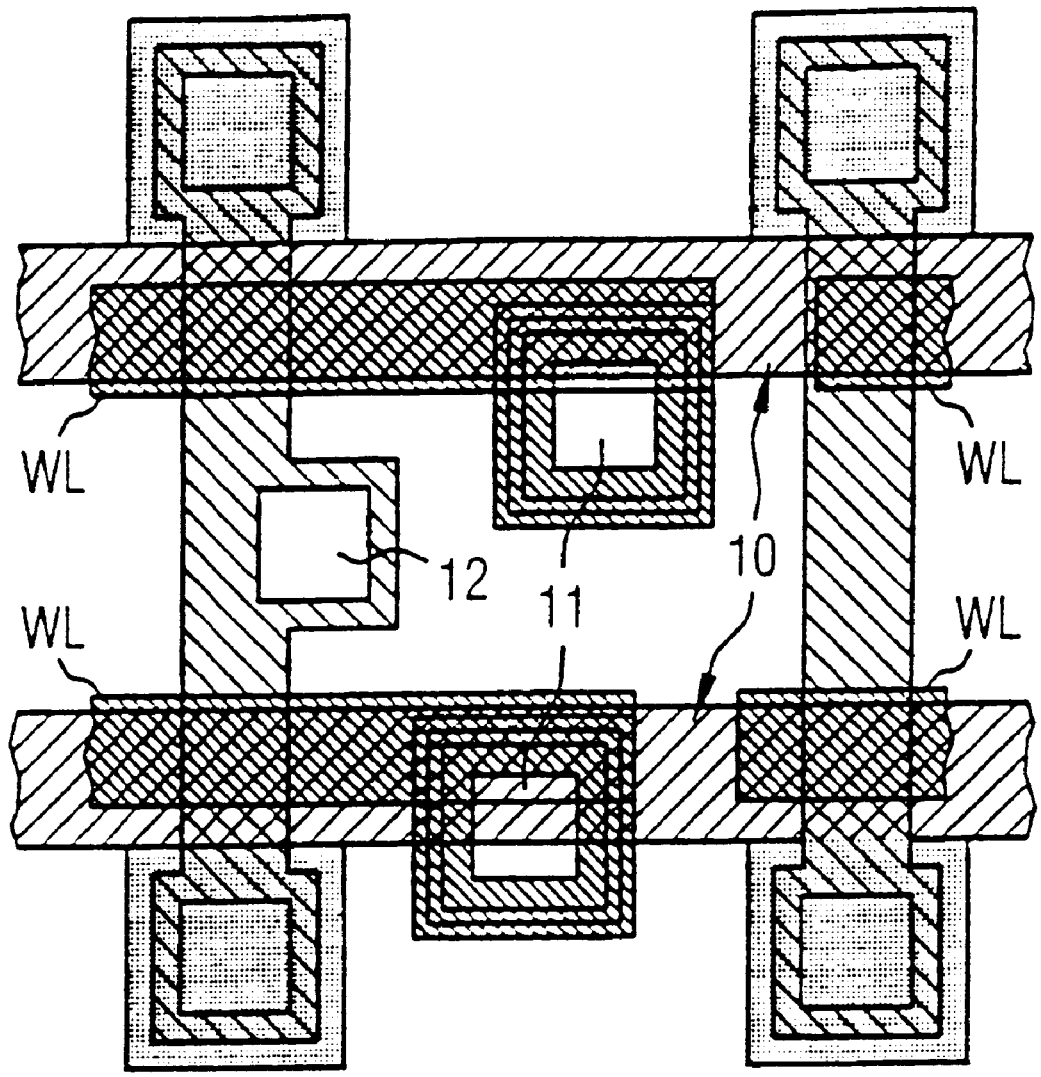
FIG. 5 shows an enlarged plan view of an intermediate cell of a prior art semiconductor read-only memory configuration.

FIGS. 3 to 5 have already been explained in the introduction. For mutually corresponding structural parts, the same reference symbols have been used in FIGS. 1 and 2, as those that were used in FIGS. 3 to 5.

Figure 1:
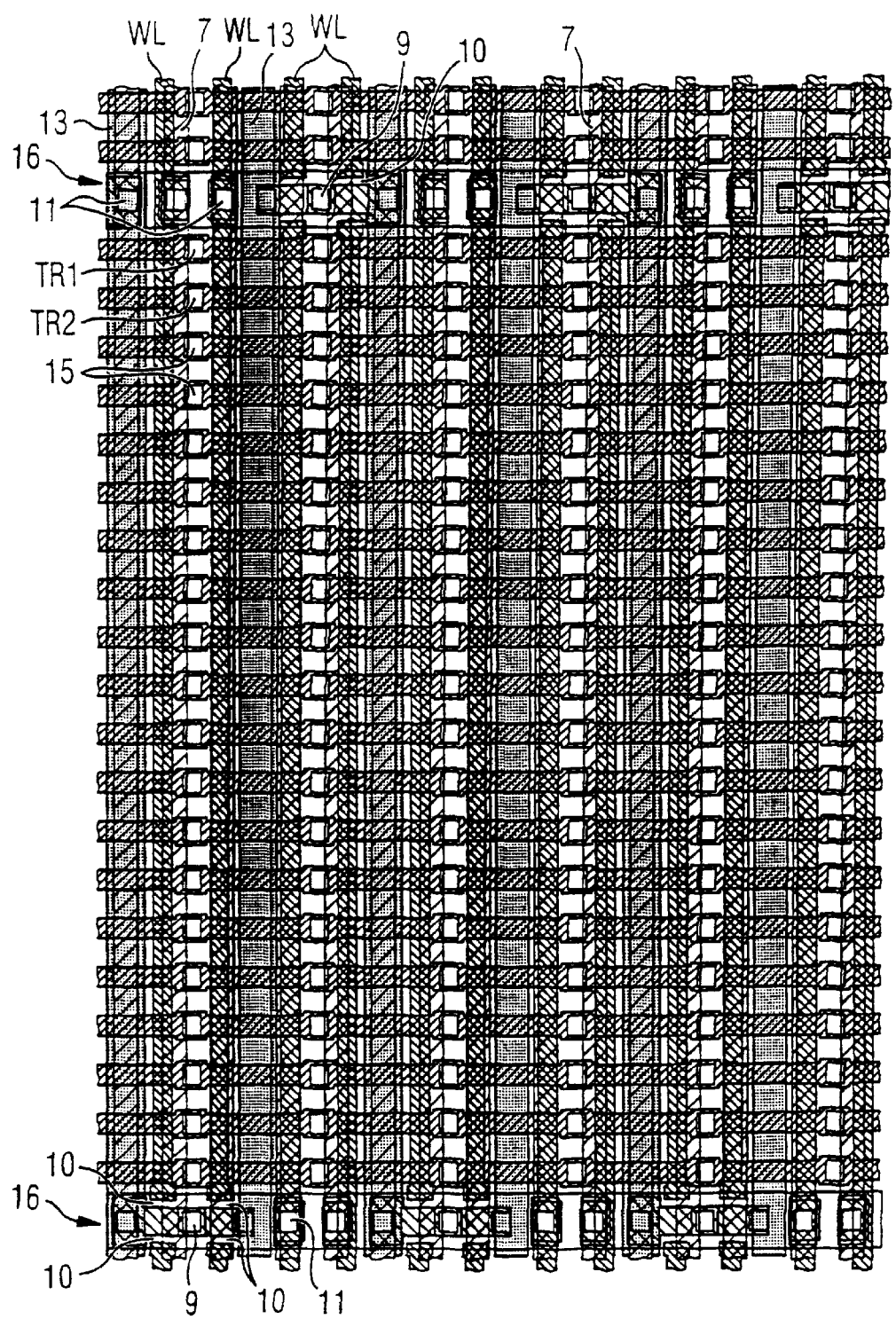
FIG. 1 shows a plan view of a semiconductor read-only memory configuration.

Referring now to the figures of the drawing in detail and first, particularly, to FIG. 1 thereof, there are shown word lines WL made of polycrystalline silicon, which—as in the case of the existing semiconductor read-only memory configuration in FIG. 3—are isolated from a metal track 7 by an intermediate insulator (not shown) made of silicon dioxide and/or silicon nitride. The metal track 7 in each case runs parallel to the polycrystalline silicon of the word line WL. Diffusion regions 13 are also shown which extend parallel to the word lines WL made of polycrystalline silicon. Diffusions 15 for individual transistors Tr1, Tr2 are alternately led below an upper or lower word line WL, with the result that the individual transistors Tr1, Tr2, etc. have their gate in the upper or lower word line WL. In particular, a read-only memory of this type is freely programmable.

Similarly to that shown in FIG. 3, a memory cell including 4×2 transistors is formed in the semiconductor read-only memory configuration shown in FIG. 1. Intermediate cells 16 are arranged in an alternately mirrored manner. Such an intermediate cell 16 has a rupture 10 of the polycrystalline silicon of the word lines WL in an alternately mirrored manner. While this rupture 10 is present in the left-hand intermediate cell 16 in the upper row of the memory cells in FIG. 1, it is arranged in the right-hand intermediate cell 16 in the second row of memory cells. In the same way, the substrate contacts 9 and also the polysilicon contacts 11 for bridging the metal tracks 7 with the polycrystalline silicon of the word lines WL are also arranged in an alternately mirrored manner. In other words, the right-hand memory cell 16 in FIG. 1 is rotated through 180° with respect to the left-hand memory cell 16 in the same figure.

What is achieved in this way is that, with only one type of intermediate cell 16, which is used in an alternately mirrored manner, in conjunction with reliable well contact connection by the substrate contacts 9, rupture 10 of the polycrystalline silicon of the word lines WL and refresh of the polycrystalline silicon of the word lines WL by the metal tracks 7 via the plated-through holes 11, a minimal amount of space is required for these intermediate cells 16. In other words, the invention enables a space saving of the order of magnitude of 42 to 47% in conjunction with a simplified macro construction, with the overall result that considerably more memory cells than in the case of the prior art can be accommodated on the same area.

FIG. 2 shows an enlarged illustration of an intermediate cell 16 in with a metalization layer 8 for feeding the reference-ground potential Vss to the substrate contact 9 and with plated-through holes 17 going to the diffusion regions 13.

We claim:

1. A semiconductor read-only memory configuration, comprising:

a semiconductor substrate;

a memory cell array located in said semiconductor substrate;

a plurality of memory cells configured in said memory cell array, each one of said plurality of memory cells including a plurality of transistors;

word lines made of polycrystalline silicon, said word lines running in a longitudinal direction, said word lines formed with ruptures located in said longitudinal direction after a first number of said plurality of said memory cells;

metal tracks running parallel to said word lines for refreshing said word lines;

an intermediate insulator isolating said word lines from said metal tracks;

a plurality of substrate contacts, each one of said plurality of said substrate contacts located after a second number of said plurality of said memory cells for applying a reference-ground potential to said semiconductor substrate; and a plurality of intermediate cells periodically located in the longitudinal direction;

each one of said plurality of said intermediate cells including a first intermediated cell half and a second intermediate cell half that are directly adjacent to one another perpendicularly to the longitudinal direction and that are alternately interchanged;

said first intermediate cell half affecting a respective one of said ruptures of a respective one of said word lines and including a respective one of said plurality of said substrate contacts; and said second intermediate cell half refreshing said polycrystalline silicon of said respective one of said word lines.

2. The semiconductor read-only memory configuration according to claim 1, said plurality of said memory cells are selected from the group consisting of diffusion read-only memories and contact read-only memories.

3. The semiconductor read-only memory configuration according to claim 2, comprising: refreshing structures for effecting said refreshing;

said plurality of said substrate contacts are present in a quantity that is the same as a quantity of said ruptures and a quantity of said refreshing structures.

4. The semiconductor read-only memory configuration according to claim 1, comprising:

refreshing structures for effecting said refreshing;

said plurality of said substrate contacts are present in a quantity that is the same as a quantity of said ruptures and a quantity of said refreshing structures.

5. The semiconductor read-only memory configuration according to claim 1, comprising:

plated-through holes formed from said metal tracks to said polycrystalline silicon of said word lines;

said plated-through holes for refreshing said polycrystalline silicon of said word lines.

6. The semiconductor read-only memory configuration according to claim 1, wherein said plurality of said intermediate cells include contacts that are all configured in a row perpendicularly to the longitudinal direction.

* * * * *